United States Patent [19]
Davidsohn

[11] 3,967,988
[45] July 6, 1976

[54] DIFFUSION GUARDED METAL-OXIDE-SILICON FIELD EFFECT TRANSISTORS

[75] Inventor: Uryon S. Davidsohn, Scottsdale, Ariz.

[73] Assignee: Motorola, Inc., Chicago, Ill.

[22] Filed: Mar. 14, 1975

[21] Appl. No.: 558,592

Related U.S. Application Data

[60] Division of Ser. No. 494,437, Aug. 5, 1974, Pat. No. 3,898,984, which is a division of Ser. No. 95,521, Dec. 7, 1970, Pat. No. 3,868,721, which is a continuation-in-part of Ser. No. 86,544, Nov. 2, 1970, abandoned.

[52] U.S. Cl. .................................. 148/187; 29/571; 357/23; 357/41; 357/89
[51] Int. Cl.² ........................................ H01L 21/22
[58] Field of Search ................. 148/187; 29/571; 357/23, 41, 89

[56] References Cited
UNITED STATES PATENTS

| | | |
|---|---|---|
| 3,440,502 | 4/1969 | Lin et al. .............................. 357/23 |
| 3,518,750 | 7/1970 | Moyle .................................... 357/89 |
| 3,841,926 | 10/1974 | Garnache et al. ................... 148/187 |
| 3,850,708 | 11/1974 | Imaizumi et al. .................... 148/187 |

*Primary Examiner*—L. Dewayne Rutledge
*Assistant Examiner*—J. Davis
*Attorney, Agent, or Firm*—Willis E. Higgins; Harry M. Weiss

[57] ABSTRACT

Metal-oxide-silicon field effect transistors (MOSFET) are shown utilizing diffusion guarding of the gate electrode of a MOSFET device and utilizing the drain of one MOSFET device as the source of the next integrally formed MOSFET device. Other types of isolation shown include the surrounding of a functional unit with a source diffusion area, and/or permanently connecting a gate electrode to a potential level for preventing signal flow past such a gate.

4 Claims, 25 Drawing Figures

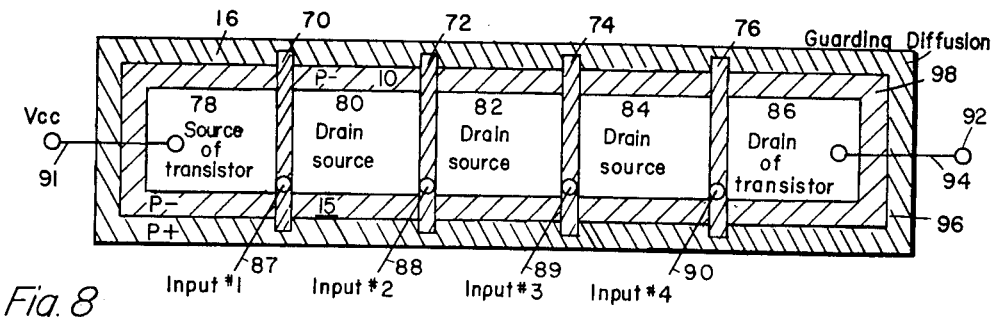
Fig. 8
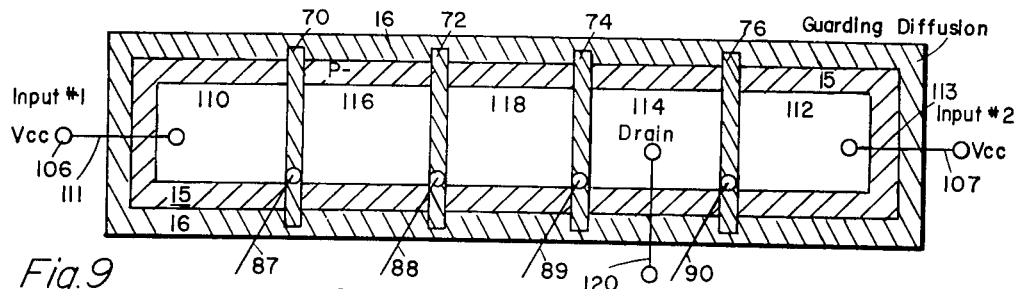
Fig. 9
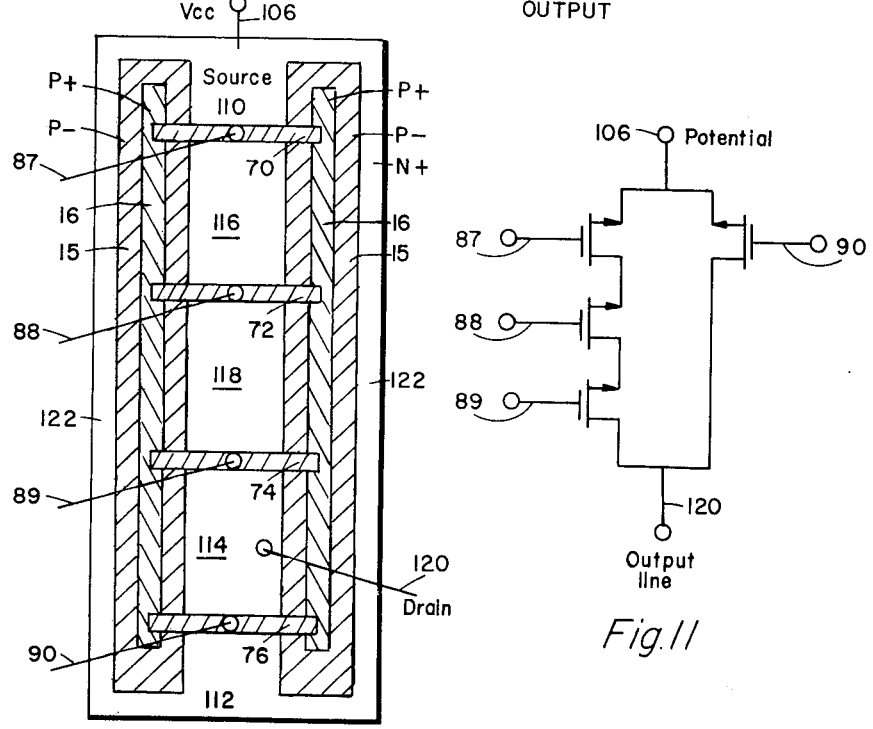
Fig 10
Fig. 11

DIFFUSION GUARDED METAL-OXIDE-SILICON FIELD EFFECT TRANSISTORS

BACKGROUND OF THE INVENTION

This is a division of application Ser. No. 494,437, filed Aug. 5, 1974, now U.S. Pat. No. 3,898,984, which is in turn a division of application Ser. No. 95,521, filed Dec. 7, 1970, now U.S. Pat. No. 3,868,721, which is in turn a continuation-in-part of Ser. No. 86,544, filed Nov. 2, 1970 (now abandoned).

The well known prior art MOSFET include individual source, drain and gate regions arrayed in the well known configuration of the gate region separating the source region from the drain region. The MOSFET is caused to operate in either the enhancement mode or the depletion mode. With proper voltage levels and polarity established at the source and drain regions, enhancement mode operation is characterized as no current flow between source and drain where no enabling signal is applied to the gate. When an enabling signal of the correct level and polarity is applied to the gate, current flows between source and drain. With proper voltage levels and polarity established at the source and drain, depletion mode operation is characterized as current flow between source and drain when no disabling signal is applied to the gate. When a disabling signal of the correct level and polarity is applied to the gate, current flow is interrupted between source and drain.

The gate layer is normally insulated from the body of semiconductor material in which the MOSFET is fabricated by a working oxide or nitride or other dielectric layer which is relatively thin enough such that control signals applied to the gate layer controls by field-effect action, the effective conductivity of the semiconductor body below the gate region (or channel). In enhancement mode devices, conductivity is established for current flow. In depleting mode devices, conductivity is removed for stopping current flow.

Individual but separate transistors, as just described, are interconnected by using strips of metallization between source and drain regions of any member of individual transistors. Normally, enabling signals or disabling signals are available to the gate regions while the current flow passes between sources and drains of the various transistors.

In such a situation using individual and separate transistors, all isolation occurs between adjacent individual transistors, which transistors comprise source, gate and drain regions. In MOSFET transistors, a deep diffusion of conductivity type determining impurities of the same type as those of the substrate surrounding individual transistors is a standard way of isolating individual components. Diffusion isolation of bipolar transistors is shown by John A. Schoeff in his U.S. Patent Application Ser. No. 62,437, filed Aug. 10, 1970, and entitled "Polycrystalline Silicon Structures For Integrated Circuits" and assigned to the assignee of the present invention, Case P-70249. Dielectric isolation using anisotropic etching is described by U.S. Davidsohn in his U.S. Patent Application Ser. No. 643,251 filed July 8, 1968 and entitled "Anisotropic Etching of Monocrystalline Silicon", and assigned to the assignee of the present invention, Case 6846.

Surface inversion problems associated with lightly doped (P) type semiconductor material when oxidizing the exposed surface of the P type material for forming passivating oxide, are described by John C. Haenichen in his U.S. Pat. No. 3,225,611. When the P type material is oxidized, there is a tendency for positive charge to develop in the oxide which draws electrons to the surface out of the P type semiconductor material under the oxide. In that interface region between the oxide and the body of semiconductor material, the electrons attracted to the interface region invert the conductivity type of the interface region and forms a surface channel.

In the MOSFET technology, there are basically two types of MOSFETs. The first of which is described as N-MOSFETS, which are devices formed in a (P-) type semiconductor body by (N+) type diffusions for forming the source region and the drain region. The second of which is described as P-MOSFETs, which are devices formed in an N type semiconductor body by (P+) type diffusions for forming the source region and the drain region. While P-MOSFET devices are not as prone to surface inversion problems as N-MOSFET devices, the subject invention lends itself well for not only providing surface guarded techniques to prevent crosstalk through surface inversion areas in N-MOSFET devices but also for providing surface guarded techniques to prevent crosswalk through surface inversion areas in P-MOSFET devices. Accordingly, the subject invention is a basic isolation system for both N-MOSFET and P-MOSFET devices which is compatible with the processing required for complementary transistor (C-MOSFET) manufacture and with the utilization of N-MOSFET and P-MOSFET devices on the same substrate.

Briefly described, the prior art solution to the surface inversion problem in N-MOSFET devices has been to make source, drain, and gate regions of an N-MOSFET circular in form. The drain is placed in the center, surrounded by the gate region and then the source region. However, this circular approach takes too much room, does not prevent source-to-source coupling due to surface inversion. The present configuration is an implementation offering 60th higher device density and eliminating the mentioned intersource coupling.

SUMMARY OF THE INVENTION

The present invention relates to a MOSFET, and more particularly to a new and novel MOSFET which contemplates the combination of two or more MOSFETs into an integrally formed, functional unit and using a diffusion guarded gate as a means for preventing undesired interaction between adjacent transistors within a group of transistors, which group of transistors operates as a functional unit.

It is an object of the present invention to provide an improved MOSFET design.

It is another object of the present invention to provide a MOSFET design wherein the source of one transistor is the drain or source of another transistor.

It is another object of the present invention to provide an advanced MOSFET design which includes a region which operates both as a source region and a drain region and which is hereafter identified as a consolidated region.

It is a still further object of the present invention to provide a MOSFET design wherein each gate electrode employed is guarded by selective diffusions such that there is no signal path around the gate.

It is another object of the present invention to terminate a string of MOSFETs arranged according to the advanced design of the present invention by connecting a predetermined gate electrode to a selected voltage potential such as to prevent current flow under the gate.

It is a still further object of the present invention to provide an improved form of isolation by specific organization of each and every functional element within the structure such that a common active area of a particular conductivity type (Primary Source) completely surrounds and encloses each and all of such functional elements and prevents undesired interaction between these elements.

Another object of the present invention is to provide an improved form of isolation, comprising: surrounding a functional unit area with an area of a first conductivity type, which area is held at the supply voltage of the functional unit and which forms an input to the functional unit; partitioning such functional unit area into a plurality of sections of said first conductivity type separated by areas of opposite conductivity type and each such area of opposite conductivity being covered by a gate metal; and guarding said gates by terminating the gate at a gate guarding diffused area, through which area there can be no signal flow around the gate.

It is another object of the present invention to utilize the source area of a MOSFET device for surrounding the entire device for giving source isolation.

Another object of the invention is to provide a new and novel enhancement mode MOSFET which contemplates the combination of two or more enhancement mode MOSFETs into an integrally formed, functional unit and using a diffusion guarded gate as a means for separating adjacent transistors within a group of transistors, which group of transistors operates as a functional unit.

A further object of the present invention is to provide a new and improved device for area control in integrated circuits.

A still further object is to provide an area control gate fashioned similarly to the gate electrode of a MOSFET and to selectively either permanently connect such area control gate to a disabling potential source for isolating the area within the gate or to connect such area control gate to a control signal source for providing both enabling and disabling signal levels to such area control gate.

Another object of the present invention is to reduce the size of MOSFET devices formed according to other teachings of the present invention to a minimum.

A still further object of the present invention is to form PN junctions within the MOSFET devices formed according to other teachings of the present invention at locations which do not adversely affect the operation of the device.

Yet another object of the present invention is to terminate a diffusion guarded gate in an area isolating diffusion employed for surrounding and isolating a specified surface area.

Another object of the present invention is to bring the diffusion guard area into contact with the source isolating area for forming a P+N+ junction in those regions having no potential difference therebetween.

These and other objects and features of this invention will become fully apparent in the following description of the accompanying drawings, wherein:

FIG. 8 is an additional embodiment of the present invention showing a multiple transistor array fabricated in a unitary body and operating as a functional unit wherein the output is available at one end of the multiple transistor array;

FIG. 9 shows an additional embodiment of the instant invention employing a plurality of transistor elements in a unitary construction wherein the output signal is available at a point intermediate both ends of the structure;

FIG. 10 shows a further embodiment of the instant invention wherein the source area surrounds the entire functional unit;

FIG. 11 is a schematic view of the structure shown in FIG. 10;

BRIEF DESCRIPTION OF THE INVENTION

Figure 1A:
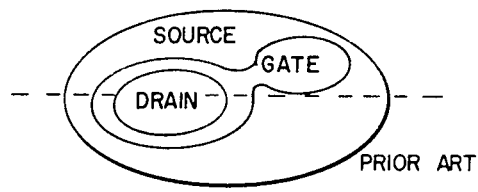
FIGS. 1a and 1b show plan and sectional views of a prior art field effect transistor wherein the gate region completely surrounds a drain region and separates it from the source.

The present invention contemplates the formation of an enhancement mode MOSFET by new and improved techniques whereby MOSFETs of unique configuration are fabricated. A first of these techniques, which render an improved MOSFET construction, concerns the diffusion guarding of the gate electrode employed in the MOSFET. The gate electrode is positioned over a gate region and the gate region separates the source region from the drain region. The diffusion guard takes the form of terminating the gate electrode in a diffused area of relatively low resistivity-high conductivity of the same conductivity type as the substrate whereby, surface channeling around such gate from source to drain is prevented by the relatively low resistivity-high conductivity diffusion.

As hereinbefore described, N-MOSFET devices are particularly prone to surface inversions at the interface between the silicon substrate-silicon dioxide passivating layer. Hence, the techniques of diffusion guarding of the gates for closing a signal path through the surface inversion area, and of surrounding an N-MOSFET device with a source area, and of gate isolating an area within a larger source area, are new means for isolating an N-MOSFET, and result in novel transistor construction.

In the manufacture of C-MOSFETs, both N-MOSFETs and P-MOSFETs are formed on a common substrate. In such a configuration the need for isolation between the P-MOSFETs and the N-MOSFETs is increased and isolation techniques as herein described are employed which are compatible in the manufacture of both such devices.

Using the diffusion guarded gate, it is possible to combine multiple transistors into a single unit. Spurious signal flow around the gates of such enhancement mode MOSFETs is prevented by the diffusion guarded gate. Such an approach also requires a minimum amount of surface area for the number of transistors required. Minimum working surface area means minimum circuit capacitance and minimum power dissipation. Surrounding the working surface of a MOSFET with the MOSFET source diffusion reduces to a minimum the capacitance of the device. The source area does not add stray capacitance value to the device since such source is connected either to the supply potential or ground, and either of which in the proper circuit configuration, is the source of current.

Using the diffusing guarded gate in a multiple transistor functional block, eliminates the need for metallization for connecting an individual source area with a separate drain and/or source area. The use of a consolidated region eliminates an interconnection between separate regions and forms an automatic, integral connection. In this manner, the number of contacts to a device is reduced to one for each gate electrode, and one for the source area and one additional contact for the drain area. By eliminating the need to make a contact to such a consolidated region, such a region is made as small as possible since the area need not be designed for attaching a contact thereto. Since the consolidated areas and the drain areas constitute the working area of the device and constitute the area which adds unwanted capacitance value to the device, the elimination of contacts to the consolidated areas greatly reduces the size of the consolidated areas and reduces the overall capacitance of the device.

The source area is employed in the present invention as a means for surrounding each functional MOSFET device. The use of the source region as an isolating member results in a device having a minimum amount of stray capacitance due to the resulting minimum working area. A still further embodiment of the present invention adds a refinement to the concept of source isolation which is called area control. Such area control results in the separation from said master source area of an integral portion of such area. The decoupling of such an included portion of said source area, from said master source area, is accomplished by employing a gate guard identical to the gate employed in the MOSFET for the gate electrode, for surrounding the area to be decoupled and the connection of such gate to the source or ground potential as the case may be. In review, the semiconductor material under a gate in an enhancement mode N-MOSFET is the lightly doped (P—) material of the substrate. The guarding gate is formed on the surface of the semiconductor material contemporaneous with the formation of the gates employed in the MOSFETs. Since the source diffusion forms an (N+) region of opposite conductivity, the attachment of such a gate to the source permanently ties the gate to its non-conducting state and no current flow occurs under the gate, thus isolating the area within the gate from the source area outside of the gate. This form of operation occurs when the appropriate gate is connected to either ground potential, the appropriate negative potential or a source of positive potential, as required to maintain the "off" state.

Figure 14:
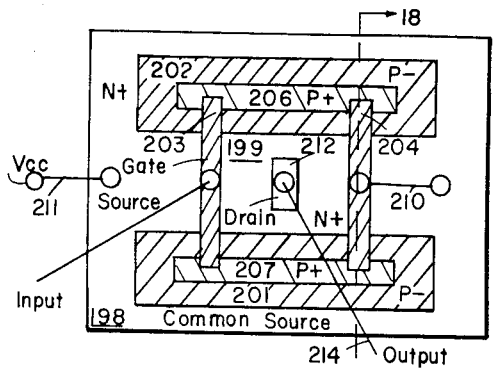
FIG. 14 is a still further embodiment of the instant invention wherein a single source drain gate transistor is shown terminated by an area guarding gate.
Figure 15:
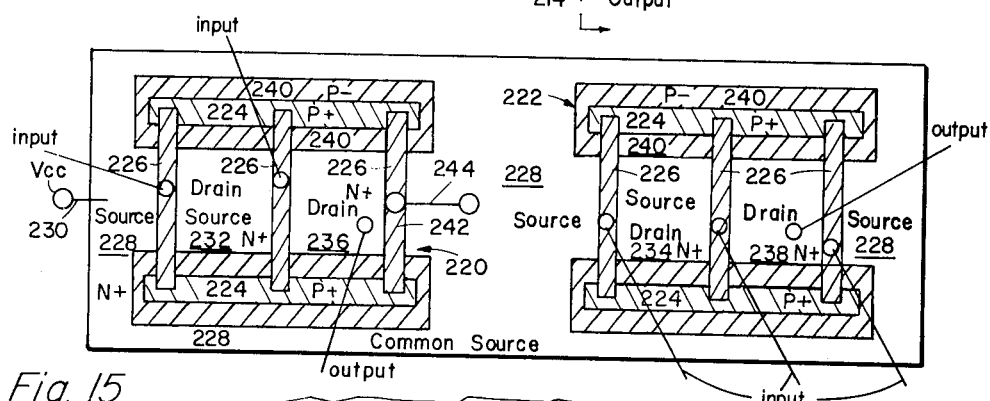
FIG. 15 shows a still further embodiment of the instant invention employing an area guarding gate for terminating a string of individual transistor elements arranged in a unitary construction.
Figure 16:
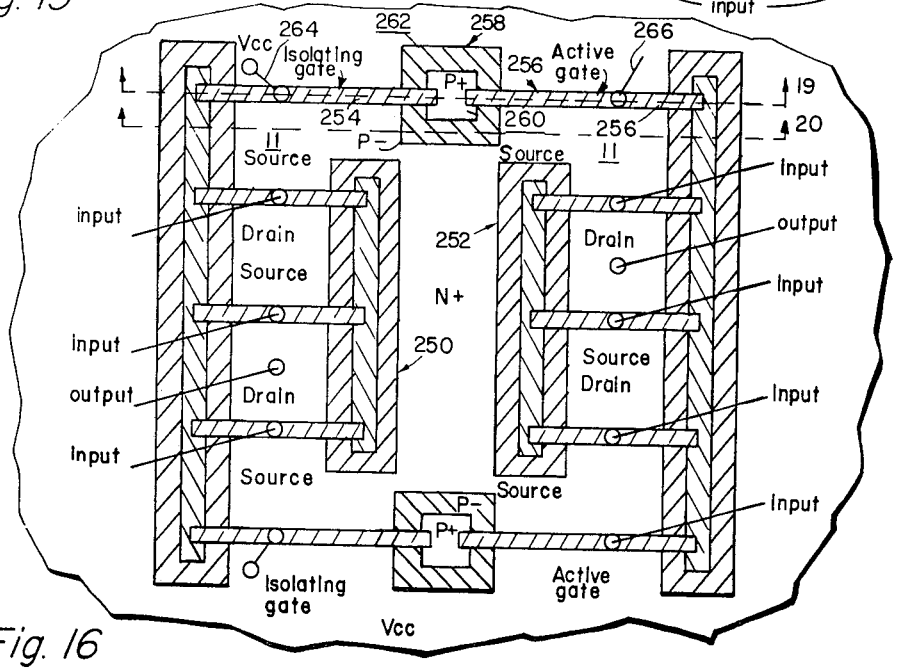
FIG. 16 shows another embodiment of the instant invention wherein the area-guarding gates are used in combination with gate-guarding diffusions and source isolation.

Variations on the configuration of a gate guarded device results in a single transistor, as shown in FIG. 14, results in a means for terminating an open ended string of consolidated areas as shown in FIG. 15, and results in decoupling portions of a complex functional block, as shown in FIG. 16.

The use of an area guard gate decouples the area within the gate from the surrounding source driving potential so that the source of the enhancement mode MOSFET inside of the gate is driven by an input signal independent of the common source potential.

Additionally, an area diffusion is formed on a surface enclosing a surface area in which additional devices are formed. In these circumstances, the area diffusion additionally operates as the diffusion guard for one end of the gates formed as part of CMOS devices within the enclosed surface area.

A further refinement of the present invention teaches the selective formation of P+N+ junctions at those junctions at which there exists no potential differences between such P+ and N+ regions. This is done to reduce further the area of CMOS devices.

DETAILED DESCRIPTION OF THE INVENTION

Throughout the several Figures, the same numeral is employed for identifying the same element shown in the various Figures. As previously mentioned both P-MOSFET devices and N-MOSFET devices can be fabricated by the technique hereinafter described. For the purpose of convenience, N-MOSFET devices are shown, since such devices have a greater use for the guarding gate diffusion employed in the present invention. Both P-MOSFETs and N-MOSFETs equally benefit from the source isolation and gate guards as described hereinafter.

Referring to the mentioned figures, the applied potential ($V_{cc}$) is shown for convenience as a positive potential. It is understood that other arrangements of supply potentials and grounds yielding the same or equivalent effect are also included.

Referring to FIG. 1a, there is shown a plan view of a prior art field effect transistor wherein the drain and source diffusion areas of N+ conductivity are separated by a gate region, which gate region completely encircles the drain diffusion. As there are many techniques or processing procedures whereby the MOSFET shown in FIG. 1a can be fabricated, it is the purpose of the FIG. 1 to demonstrate that gate regions have, in fact, in prior art transistors surrounded the drain region whereby no communication between the drain and source region can occur except during the activation of the gate region. However, there are certain drawbacks of the design shown in FIG. 1, the first of which is the fact that this design requires a considerable amount of surface area. When forming a part of an integrated circuit the device shown in FIG. 1 is then isolated from the remaining circuitry on the same chip by way of deep diffusions well known in the prior art or by way of back biased PN junctions also well known in the prior art or by using dielectric isolation.

Figure 1B:
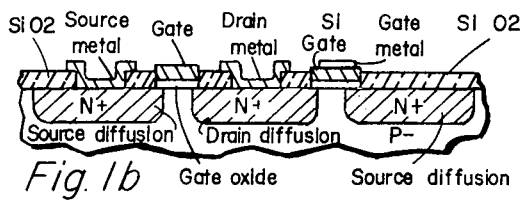

Referring to FIG. 1b, there is shown a sectional view of the device shown in FIG. 1a. A (P−) conductivity type silicon substrate includes a central portion of (N+) conductivity which forms the drain region, surrounded by a portion of the original (P−) conductivity type silicon substrate, underlying the gate electrode of the device, which (P−) silicon forms the gate region. Surrounding both the gate region and the drain region lies the source region. While the source and drain regions are formed during the same diffusion step, the gate region is formed from the original silicon substrate body. Ohmic contacts are made to the source and drain regions by aluminum metallization while the gate metal is placed over a gate oxide layer. The gate metal may be a metal or polycrystalline silicon gate layer.

Figure 2A:
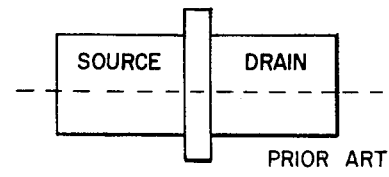
FIGS. 2a and 2b show plan and sectional views of a prior art field effect transistor wherein the source and drain regions are of rectangular orientation and are separated by a gate region.
Figure 2B:
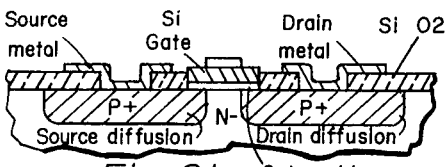

Referring to FIGS. 2a and 2b, there is shown an additional embodiment of the prior art MOSFET wherein the source and drain regions are separated by a rectangular shaped gate region which does not surround the drain region. The gate electrode is overlying a portion of the original substrate from which the transistor is formed. In a P-MOSFET transistor, the substrate would be an (N−) conductivity which is a relatively low conductivity of a first type, and the source and drain regions are formed by substantially heavy (P+) diffusions into portions of this substrate such as to change the source and drain areas into relatively high conductivity of a second conductivity type. Source and drain electrodes are attached to their respective regions along with the formation of the gate electrode.

When employing transistors having a design as shown in FIGS. 1a and 1b, and FIGS. 2a and 2b, it is normal to isolate each particular individual transistor and then connect the drain of one such transistor to the souce of another or other source of one to the drain of a still third transistor when maximum isolation is needed. In those situations not requiring maximum isolation, groups of individual transistors are isolated from other such groups. However, each such transistor comprises source, drain and gate regions. In this manner for two individual transistors, four diffused regions are required separated into pairs of regions and each pair of regions is separated by a gate region controlled by a gate electrode. As is more fully described hereinafter, for a minimum of two transistor elements manufactured according to the concept of the present invention, approximately three diffused areas are required employing two guarded gates and surrounded for additional isolation by the source diffusion itself.

Figure 3:
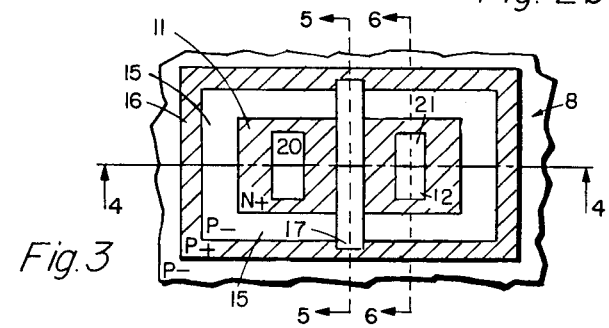
FIG. 3 shows a schematic view of a first embodiment of the present invention wherein the ends of a gate electrode for a field effect transistor are terminated in a diffusion guard.
Figure 4:
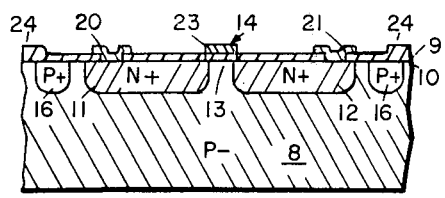
FIG. 4 is a cross-sectional view taken along the line 4—4 of the device shown in FIG. 3.
Figure 5:
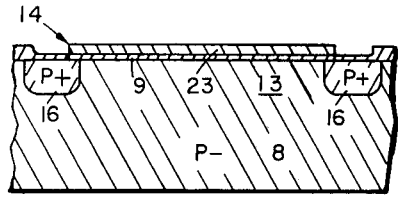
FIG. 5 is a cross-sectional view taken along the line 5—5 through the gate electrode of the device shown in FIG. 4.

Referring to FIG. 3, there can be seen the first technique employed in the manufacture of the improved MOSFET design according to the teachings and concepts of the present invention. In such a transistor embodiment, the rectangular MOSFET design is employed wherein a semiconductor substrate, of (P−) conductivity forms a basic body 8 of semiconductor material in which the MOSFET is fabricated. A thin layer 9 of oxide or nitrate or other passivating layer found to operate satisfactorily as the working gate of a MOSFET, is formed over the surface 10 of the body 8. Both the layer 9 and the surface 10 of the body 8 are best seen with reference to FIG. 4. The process steps utilized in forming the devices illustrating the present invention are standard and well known in the prior art and need not be repeated here in great detail. Conductivity type determining impurities are passed into the substrate for forming the source and drain regions 11 and 12 respectively. The source and drain regions are of relatively high, and opposite conductivity type compared to said substrate and because of the high doping concentration are identified as (N+). A region 13, seen more clearly in FIG. 4, is positioned under a gate electrode 14, and as shown in FIG. 5 is formed integral with the body 10. The gate electrode extends over the thin layer of oxide 9 and beyond the source and drain diffusion areas as shown in FIG. 3 and across a portion of an upper surface 15 of the substrate 10.

A diffusion guard area 16 is formed underlying the ends 17 and 18 of the gate electrode 14 and encircling the source and drain areas 11 and 12 respectively and space slightly therefrom by the portion of the surface area identified as 15. This area 15 surrounds the source and drain areas except for that portion interrupted by the gate region 13. As a matter of choice, the area 16 is formed prior to forming the gate electrode 14 and hence the diffusion guard area underlies the gate electrode 14. Conversely, the gate electrode is formed prior to the guard diffusion and the gate electrode abuts the diffusion area. Either approach is acceptable provided there is no path around the gate and signal flow under the gate is controlled by an enabling signal in the gate electrode. The area 16 is formed by diffusing conductivity type impurities into the area 16. The conductivity type impurities change the semiconductor body type from its (P−) conductivity type to a relatively higher conductivity level of the same conductivity type identified as a (P+) conductivity. Boron is a suitable impurity for this purpose. In the placement of this diffusion guard, it is important that the diffusion is made over the ends 17 and 18 of the gate electrode 14 and does not come in contact with the source and drain regions 11 and 12 respectively. In this manner, the surface of the (P+) area 16 is prevented from inverting due to the relatively high doping level of this portion of semiconductor body 10. The surface area as at 15 is likely to invert when the lightly doped (P−) type material is passivated by a silicon dioxide layer. As is well know, the interface between the silicon dioxide and the lightly doped (P−) type material attracts electrons from the body of the semiconductor material and after a passage of a certain amount of time, the surface region quite possibly inverts and without the diffusion guard area 16, a cross-talk path exists between the source and drain regions 11 and 12. However, using the diffusion guard area 16 underlying the gate electrode 14, no surface path exists between the source and drain regions 11 and 12 respectively except under the gate as controlled by the signals supplied to the gate 14. It is important that the diffusion guard area 16 does not come in direct contact with either of the source and drain areas 11 and 12 respectively because of their respective, relatively high doping levels and because they are of opposite conductivity type. Any such point of contact becomes a degenerate diode of low breakdown voltage when a potential difference exists between the regions and thereby reduces the effectiveness of the operation of the transistor. As described hereinafter with reference to FIGS. 21, 22 and 23 N+ and P+ areas are placed adjacent each other when a potential difference does not exist across such areas. Ohmic contacts are made to the source and drain regions as at 20 and 21 respectively.

Referring to FIG. 4 there can be seen a cross-section of the device shown in FIG. 3. The body of semiconductor material 8 is shown more clearly in FIG. 4 including the source and drain diffusion areas 11 and 12 respectively, which regions are shown separated by the portion 13 of the semiconductor body 8 located under the gate electrode 14. The gate electrode 14 conveniently may be what is known as a silicon gate which comprises the layer of silicon oxide 8 and a doped layer of polycrystalline silicon 23. A thicker portion 24 of surface oxide is formed during the processing of the device and is employed as a passivating layer.

Referring to FIG. 5, there is shown a cross-sectional view of the device illustrated in FIG. 3, which cross-section is taken through the gate electrode 14 of the device. The semiconductor body is again shown at 8 and because of the location of the cross-sectional view, the diffusions for the source and drain are not shown, and the only material shown is (P−) conductivity type of the body 8 and the integrally formed gate region 13 positioned under the surface oxide 9 and the gate polycrystalline layer 23. The diffusion guard area 16 is shown underlying the multiple layer gate element 14. In this manner, since a diffusion guard area 16 completely encircles the source and drain regions except in that area controlled by the gate electrode 14, there is no way for a signal to pass from the source region and drain region except under or as permitted by the gate electrode 14.

Figure 6:
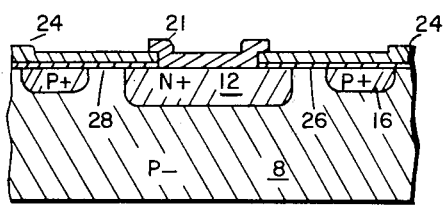
FIG. 6 is a cross-sectional view taken along the line 6—6 of the device shown in FIG. 4 showing the relationship of the drain diffusion with the gate guarding diffusion.

Referring to FIG. 6, there is shown an additional cross-sectional view of the device shown in FIG. 3 taken along the center portion of the drain electrode 21. In FIG. 6, the semiconductor body is shown at 8 and the drain diffusion, having a relatively high conductivity level and of a second type conductivity is shown as the (N+) portion 12. The silicon dioxide surface layer is shown at 9. The relatively high conductivity diffusion of the guarding diffusion area 16 is shown separated from the relatively high conductivity level and opposite conductivity-type region of the drain 12 by a portion of the relatively low first-type conductivity region of the semiconductor body 8 as represented in the areas 26 and 28. The regions 26 and 28 separate the areas 12 and 16 of relatively high conductivity and opposite conductivity-type materials for preventing a short-circuit therebetween and thus destroying the operation of the element. As described more fully with reference to FIGS. 21, 22 and 23, N+ and P+ areas are placed adjacent to each other when a potential difference does not exist between the regions. The relatively thicker passivating layer is shown at 24.

Figure 7:
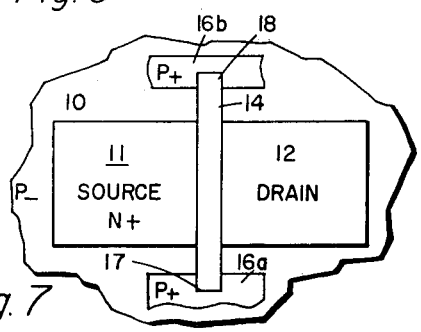
FIG. 7 is a schematic of a second embodiment of the instant invention showing a segmented gate guarding diffusion.

FIG. 7 shows a basic building block of the present invention wherein source and drain regions 11 and 12 respectively are separated by a gate electrode 14 having its ends 17 and 18 overlying or abutting a relatively high conductivity region 16a and 16b respectively, when that conductivity level is compared with the conductivity level of the substrate body 8.

Referring to FIG. 8, there can be seen another embodiment of the invention characterized by employing a plurality of individual gate electrodes 70, 72, 74 and 76. Each of the gate electrodes similar in design to the gate electrode 14 shown in FIGS. 3 and 4 overlies a diffusion guard area 16. The (P−) substrate 8 has diffused therein and associated with each of the gates 70, 72, 74 and 76 a plurality of source and drain areas 78, 80, 82, 84 and 86. Each of such aforementioned source and drain areas are separated from each other by a corresponding gate 70, 72, 74 and 76. A source region 78 is separated from the consolidated drain-source area 80 by the gate 70. An input enabling signal is applied to the gate 70 over an input metallization strip 87. The source-drain consolidated area 80 is separated from the source-drain consolidated area 82 by the gate 72. An input enabling signal is applied to the gate 72 over an input metallization strip 88. The drain-source consolidated area 82 is separated from the drain-source consolidated area 84 by the gate electrode 74. An input enabling signal is applied to the gate 74 over an input metallization strip 89. The drain-source consolidated area 84 is separated from the drain area 86 by the gate electrode 76. An input enabling signal is applied to the gate 76 over an input metallization strip 90. A source of potential $V_{cc}+$ or ground (or ground and $V_{cc}-$) depending whether the device as shown is an N-MOSFET or P-MOSFET, is applied to the source area 78 by a metallization strip 91, while the output of the circuit is available at an output terminal 92 interconnected with the drain 86 of the functional unit by a metallization strip 94.

The functional unit shown in FIG. 8 is a four signal AND gate. In operation, since the structure is an enhancement mode N-MOSFET, the gate region is normally nonconducting unless an enabling signal is applied to its corresponding gate electrode. Accordingly, enabling signals must be applied to all of the gates 70, 72, 74 and 76 before current flow can occur between the source of positive potential $V_{cc}$ and the output terminal 92. The diffusion guarded gates prevent cross talk between adjacent areas such as source 78 and consolidated area 80. As can be seen from the drawing, no ohmic contact is required at the consolidated regions, such as 80, serves as the drain for the source 78 and the source for the consolidated area 82.

Referring to FIG. 9 there is shown substantially the same configuration as shown with regard to FIG. 8 with certain changes. A voltage potential level is available at a first input terminal 106 and the same voltage potential level is available at a second input terminal 107. $V_{cc}$ is applied to a second source area 112 from the terminal 107 by a metallization strip 113. The gates 70, 72, 74 and 76 again separate and divide the source areas 110 and 112, a drain area 114 and consolidated areas 116 and 118. The input enabling or disabling signals are available on the input lines 87 through 90. However, in this embodiment the output signal is taken from the drain region 114 over an output metallization strip 120. Each end of the gates 70, 72, 74 and 76 overlie the diffusion guard area 16 while intermediate the diffusion guard area 16 and the various source areas 110 and 112, and consolidated areas 116 and 118 and the drain area 114 is the relatively lower conductivity portion (P−) of the substrate identified again as 15. The structure shown in FIG. 9 employs a pair of potential source input terminals at 106 and 107 and a single drain region such as at 114 from which the output signal is taken over a metallization strip 120. In operation, the circuit shown in FIG. 9 is a two leg OR circuit having a three signal AND gate in one leg and a single signal gate in the second leg. When three enabling signals are available as the lines 87, 88 and 89, an output signal is available at the output line 120. Or when an enabling signal is available on the line 90, an output signal is available at the output line 20.

Referring to FIG. 10 there is shown the same logic circuit shown with reference to FIG. 9 with the added advantage of source isolation. In the configuration shown in FIG. 10 the source areas 110 and 112 are joined by source extension areas 122. In this manner, a source area comprising 110, 112 and 122 completely surrounds the functional block preventing any signal flow from internal the functional block to external thereof. Additionally, the use of this area as source area reduces the capacitance value of the structure since source area does not add to working capacitance value. Similar to the structure shown in FIG. 9, the ends of the gates 70, 72, 74 and 76 overlie the diffusion area 16. The (P−) substrate portion 15 of the structure shown with reference to FIGS. 3 and 9 now encircles the diffusion guard area 16 in combination with an additional area 15'. The area 15' is added to the structure shown in FIG. 9 for separating the high (N+) conductivity of the expanded source area 122 from the high conductivity opposite conductivity type (P+) of the diffusion guard area 16 as more fully described with reference to FIGS. 21, 22 and 23, N+ and P+ areas are adjacently positioned where no potential difference exists across such P+ and N+ regions. Since the source areas 110, 112 and 122 surround the function block only one $V_{cc}$ input terminal need be employed in the structure shown in FIG. 10. It should be kept in mind that whenever the use of a potential source such as $V_{cc}$ is mentioned, it can be of either polarity or ground as the case requires. Whenever, one level is selected as the $V_{cc}$, the other level is automatically fixed according to well known techniques.

FIG. 11 shows the electrical schematic of the device shown in FIG. 10. Three AND gates, having the inputs 87, 88 and 89 provide one portion of the signal to be OR'd with a single input available at the terminal 90. The output signal is available at the output line 120.

Figure 12:
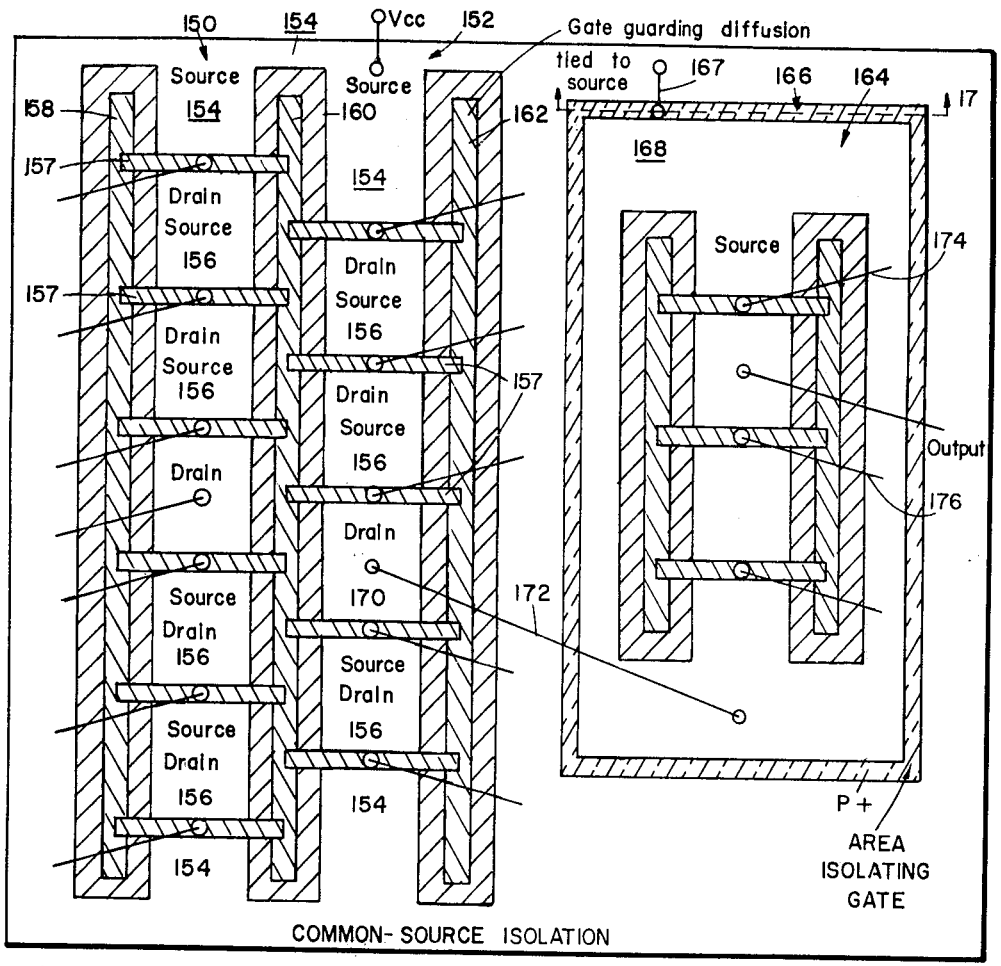
FIG. 12 is a still further embodiment of the instant invention utilizing gate-guarding diffusions, common-source isolation and an area-isolating gate surrounding an entire functional unit.

Referring to FIG. 12 there is shown an additional embodiment of the instant invention wherein a plurality of functional blocks 150 and 152 are shown having a common source area represented at 154. Each of the multi-element functional units 150 and 152 are shown having a plurality of consolidated areas 156. Additionally, the source region 154 completely surrounds the multi-element functional units for reducing the total capacitance of the circuit and for providing source isolation between units.

A plurality of gate electrodes 157 are shown terminated in an overlying relationship with a diffusion guard area. A first such diffusion guard region is shown at 158, a second region at 160 and a third at 162.

It is important to note that the embodiment represented in FIG. 2 demonstrates the use of a single diffused guarding area 160 for terminating gates employed in a plurality of functional units 150 and 152, whereby crosstalk is prevented not only from drain to the source region of the same functional block but also between adjacent functional blocks. The source region 154 is shown connected to a potential source represented as the $V_{cc}$.

Figure 17:
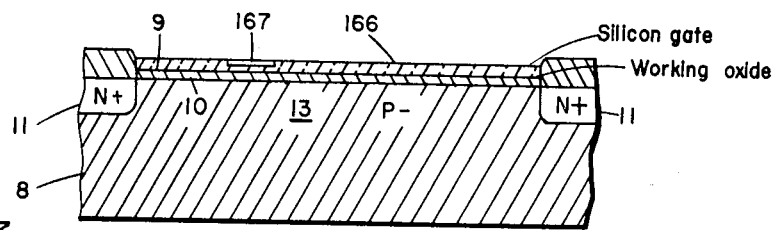
FIG. 17 is a cross-sectional view taken along the line 17—17 shown in FIG. 12.

An additional functional block area 164 is shown surrounded by an area isolating gate 166 which complete surrounds the functional block 164. The area isolating guarding gate 166 is formed in the same manner and during the same processing step as the gate electrode previously described in greater detail with respect to FIGS. 3 through 5. Referring to FIG. 17, the area isolating gate comprises a gate region 13 of the substrate material 8. In the configuration shown, the substrate is (P−) material. The layer of working oxide is shown as 9 formed on the surface 10 of the substrate 8. As is becoming accepted throughout the industry, a silicon gate electrode 23 is shown. The source diffusion is shown at 11. Since the source 11 surrounds the area 164 shown in FIG. 12, the source is shown on both sides of the area isolating gate 166 shown in FIG. 17. This gate 166 is pinned to the source potential $V_{cc}$ by a metallization strip 167 as shown in FIG. 12 for completely isolating the logic block area 164 from the remaining source area 154. In this manner, a source region 168 of the functional block 164 is driven by the output from a drain region 170 of the functional block 152 over a line 172.

The interior portion of the functional block 164 is shown again as represented by a two-legged OR circuit having two input signals applied over the lines 174 and 176 on one leg and a single input signal shown on the other leg. It is not important what function is shown within the block 164 because any such function is possible. FIG. 12 shows a functional unit 164 surrounded by an area isolating gate 166, thereby isolating the functional unit 164 from the source area 154 whereby the source area 168 of the functional unit 164 is driven by the output signal from the drain 170.

Figure 13:
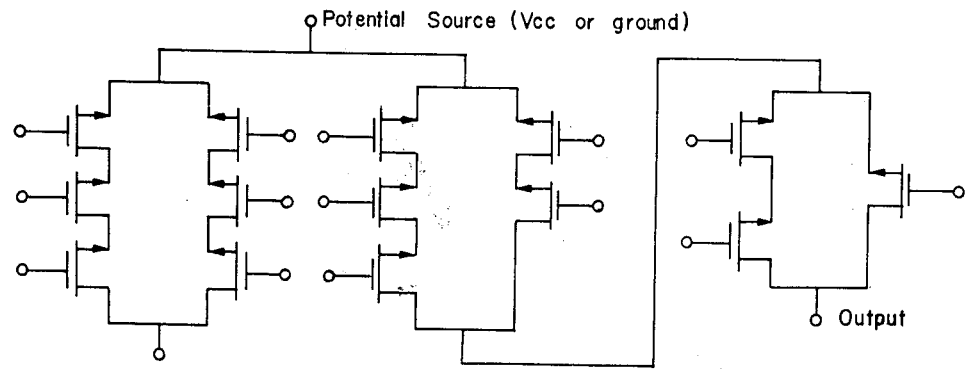
FIG. 13 is a schematic view of the structure shown in FIG. 12.

FIG. 13 shows the schematic representation of the logic performed by the circuit shown in FIG. 12.

Referring to FIG. 14, there is shown an embodiment of the present invention which employs all the advanced isolation techniques described hereinbefore for the fabrication of a functional unit featuring a single N-MOSFET device. A source isolation area is shown at 198 and a drain area is shown at 199. In an N-MOSFET device both regions 200 and 202 comprise an (N+) conductivity type region. Since the embodiment shown is an N-MOSFET device, the substrate body is (P−) conductivity type. Hence, the areas 201 and 202 are (P−) conductivity areas since they are characterized as being of the same type of conductivity as the substrate body. This is not to be interpreted as necessary to the invention that this area must be of exactly the same doping level of the remaining substrate body, but only that an additional step need not be employed to alter the conductivity from that of the substrate body in order for the present invention to function properly. It is obvious that the areas 201 and 202 could be slightly further reduced in conductivity level if desired.

A pair of gate electrodes 203 and 204 are fabricated according to standard techniques and terminate in an overlying relationship within the areas 201 and 202. Diffusion guard areas 206 and 207 are formed wholly within the areas 201 and 202, which areas 206 and 207 are underlying the ends of the gates 203 and 204. As is hereinafter described with reference to FIGS. 21, 22 and 23, the source isolation area 198 and the diffusion guard areas 206 and 207 can be placed in abutting relationship when no potential difference exists across the P+N+ junction. As in all other usage of the diffusion guard areas, the restrictions relied upon for proper operation of the present invention include that no path exist between region to region around a gate but that any signal flow must be under a gate. Therefore, the gates 203 and 204 may extend beyond the guard areas 206 and 207, but this extension serves no useful purpose.

Strictly as a matter of preference, gate 204 is permanently attached to the source area 200 by a metallization strip 210. In this manner, signal flow never occurs under the gate 204 because the signal, applied to the source area in either an enhancement mode P-MOSFET or an enhancement mode N-MOSFET, is not an enabling signal when applied to the gate electrode of the same device. Since the structure shown in FIG. 14 illustrates a single MOSFET device made incorporating all the techniques of the present invention as hereinbefore described, it is just as effective to connect the gate 203 to the substrate potential for preventing signal flow under the gate and keep the gate 204 as the active gate as it is to connect the gate 204 to the substrate and leave the gate 203 as the active gate as is shown in the Figures.

Figure 18:
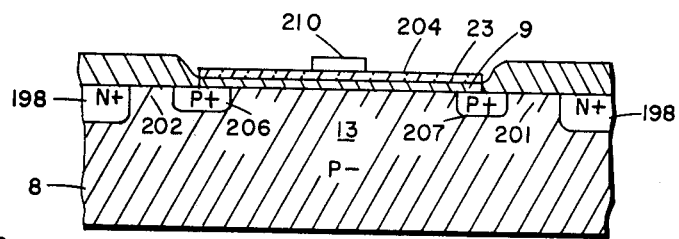
FIG. 18 is a cross-sectional view taken along the line 18—18 shown in FIG. 18.

The input signal is applied to the active gate electrode 203. The driving potential for the device is applied to the source 198 by a lead 211 and the output signal is taken from a drain electrode 212 over an output lead 214. Referring to FIG. 18 there can be seen a cross section taken through the gate electrode 204. The gate electrode 204 comprises the oxide working layer 9 covered by the silicon gate electrode 23. The area isolating gate 204 terminates in a position overlying diffusion guarding areas 206 and 207. These diffusion guarding areas lie wholly within the (P—) surface substrate areas 202 and 201 respectively for separating the (N+) diffusions of the diffusion guarding areas 206 and 207 from the source (N+) region 198. The metallization strip 210 connects the gate electrode 204 to $V_{cc}$. In an enhancement mode N-MOSFET, these permanently prevent signal flow under the gate 204 thus isolating the drain region 199 from the remaining device.

An additional embodiment of the present invention is shown in FIG. 15, for further illustrating the use of the gate guard as an area isolating gate. A pair of functional units 220 and 222 are shown in FIG. 5 employing diffusion guard areas 224 for preventing current flow except under a plurality of gates 226. An isolating source area 228 surrounds each of the functional units 220 and 222 and is shown connected to the potential source $V_{cc}$ by a line 230. The functional units are further characterized as being N-MOSFET devices, hence the source area 228, consolidated areas 232 and 234 and drain regions 236 and 238 are all of relatively high conductivity (N+) material. As previously mentioned, the diffusion guard areas 224 are of opposite conductivity but also of relatively high doping levels to be identified as (P+) material. These guard areas 224 are separated from the (N+) conductivity areas by the substrate material 240 identified as (P—) material. As more fully described with reference to FIGS. 21, 22 and 23, P+ areas and N+ areas can be safely placed in abutting relationship when no potential difference exists between the P+ and N+ regions.

One of the gates 226, further identified as 242 is connected to the source area 228 by a metallization strip 244. This prevents any signal flow under the gate 242. The device illustrated in FIG. 15 shows that the area isolating gate technique is useful for terminating a multi-element string of devices. Such termination is effective for any length of multi-element devices. The functional unit 222 comprises an OR circuit having a two signal AND gate as one of its legs and a single signal as its other leg. The functional block 220 is a two signal AND gate. Since the gate 242 is connected to the source area 228 and hence to $V_{cc}$, no signal flow occurs under the gate 242. The remaining two signals are applied to the gate 226 in the unit in the form of an AND condition.

Referring to FIG. 16, there is shown a still further embodiment of the present invention illustrating the use of the area isolating gate in combination with an "area stop" element.

A pair of functional units 250 and 252 are shown utilizing the diffusion guarding of the gates employed therein and source isolation. In the embodiment shown in FIG. 16, the area guard gate previously shown as a simple passive device such as at 242 in FIG. 15, is now shown to include an isolating gate 254, an active gate 256 and an "area-stop" structure 258.

As in all other uses of a guarding diffusion, the gate to be guarded is terminated in the guard diffusion area opposite in conductivity from the source conductivity and separated from the source by a portion of the substrate body. As in all other cases the P+ guard diffusion areas can safely abut an N+ source area when no potential difference exist between the regions.

The word termination includes placing the gate to be guarded in an overlying relationship to at least two portions of the gate, which portions are in spaced relationship. The area between the two portions becomes the working area of the gate. Since N-MOSFET devices are illustrated, the area stop structure 258 comprises a guarding diffusion area 260 of (P+) conductivity and a substrate area 262 of (P—) conductivity. The source, drain and consolidated areas are (N+) conductivity. The isolating gate 254 is connected to the source of potential $V_{cc}$ by a metallization strip 264, while the active gate 256 is controlled by the signal on the line 266.

In operation a signal is applied to the common source area of the functional blocks 250 and 252 upon the application of an enabling signal to the active gate 266.

Figure 19:
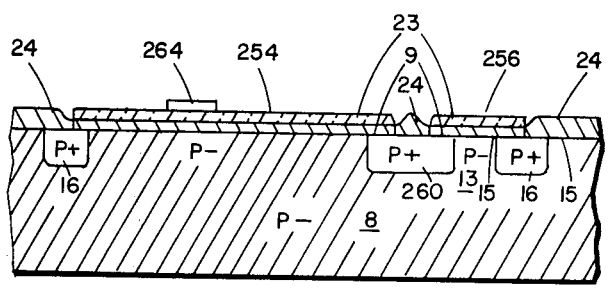
FIG. 19 is a cross-sectional view taken along the line 19—19 shown in FIG. 16.

Referring to FIG. 19, there can be seen a cross sectional view taken through the isolating gate, the active gate, the are stop and the gate diffusion areas. The substrate is again shown at 8 having the diffusion guard areas shown at 16 and being in underlying relationship with the active gate shown at 256 and the isolating gate shown at 254.

Both gates overlie the diffusion guard area 260 within the "area stop" 258. Both the gates 254 and 256 comprise a working oxide 9 formed on the substrate, and covered by the gate metal, such as a silicon gate layer 23, for lower threshold voltage values and/or aluminum in non-voltage critical situations. Other gate metals, acceptable in the prior art as a gate metal is usable in the present invention. The passivating oxide is shown at 24 which is employed for preventing contamination of the semiconductor device. The gate region 13 is positioned under both of the gates 254 and 256 and is formed integral with the substrate body 8. The basic difference between the area isolating gate 254 and the active gate 256 is that the area isolating gate 254 is connected to a voltage level such as to prevent current flow under the gate. Since the device shown is an enhancement mode N-MOSFET, the connection of the gate electrode to the same potential source level as the source itself by the lead 264 prevents the signal flow under the gate.

Figure 20:
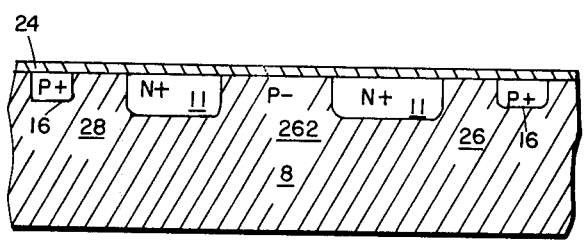
FIG. 20 is a cross-sectional view taken along the line 20—20 in FIG. 16.

Referring to FIG. 20, there can be seen a cross sectional view taken through the device shown in FIG. 16 along the line 20—20. The substrate again is shown at 8 having the guarding diffusions shown at 16. In this view the source diffusion 11 is shown interrupted by an integrally formed portion 262 of the substrate body, which portion also forms a part of the area stop element 258. Each (N+) type diffusion should preferably be separated from each (P+) type diffusion or else a destructive short circuit occurs or the device may be degraded in performance. As described with reference to FIGS. 21, 22 and 23, the N+ and P+ regions can be placed in abutting relationship when no potential difference exists between the regions of N+ and P+ material. The type of separation shown in FIG. 20 is the use of the (P—) type conductivity of the basic semiconductor body 8. Just as in FIG. 6 where the drain diffusion 12 is separated from the guard diffusion 16 by integrally formed portions 26 and 28 of the substrate body 8, the source diffusion 11 shown in FIG. 20 is separated from the guard diffusion 16 by the portions 26 and 28 of the body 8. A surface passivating oxide is shown at 24.

These guarding diffusions need not be separated from the common isolating (or primary) source when source and substrate are at the same potential.

Figure 21:
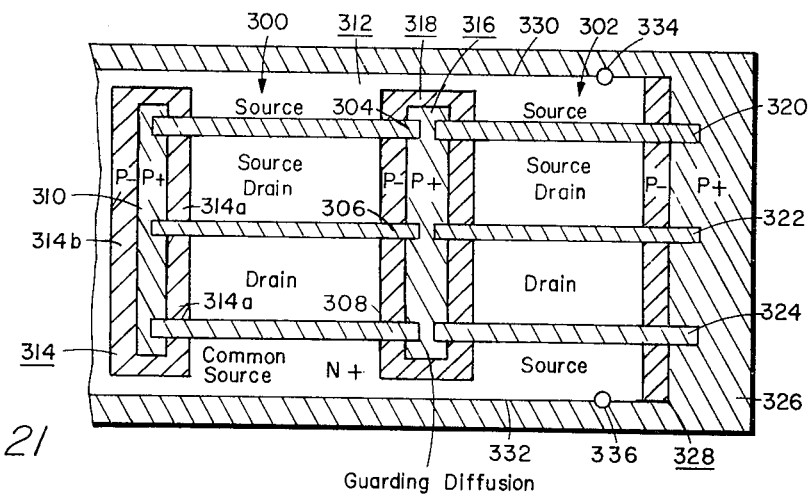
FIG. 21 is a plan view showing the diffusion guarding of one end of a gate electrode by an area isolating diffusion.

Referring to FIG. 21, there is shown an additional embodiment of the present invention employing functional block indicated generally at 300 and a second functional block indicated generally at 302. The functional block 300 comprises a plurality of gates 304, 306 and 308. A corresponding end of each of the gates terminates in a P+ diffusion guard area 310, which area 310 is separated from the N+ source diffusion isolation area 312 by a portion 314 of the P— substrate 8 in which the functional block is built. The portion 314 comprises an inner segment 314a across which the gates 304, 306 and 308 extend and, an outer segment 314b employed for separating the region P+ 310 from the encircling source N+ region 312. The other end of the gates 304, 306 and 308 terminates in a second diffusion guard area 316, which area 316 is separated from the N+ source diffusion area 312 by an integral portion 318 of the substrate 8.

The functional block 302 comprises a plurality of gates 320, 322 and 324, and a corresponding end of each of the gates terminates in the diffusion guard area 316. The remaining ends of the gates 320, 322 and 324 terminate in an area diffusion guard region 326. Since the region 326 is a P+diffusion it not only functions for guarding signal flow around the gates 320, 322 and 324 but also prevents signal flow into and out of the area defined by the region 326. Gates 320, 322 and 324 extend across a portion 328 of the substrate 8. The P+ diffusion of the region 326 abuts the N+ source region at that portion of the N+ source region which operates as a source isolation region such as at 330 and 332. In order to insure that regions 326 and 312 are kept at equal potential levels at the required interface, a plurality of metal contacts such as at 334 and 336 are formed adhering to both regions 326 and 312. Each of said contacts 334 and 336 electrically connect both regions 312 and 326 together.

Figure 22:
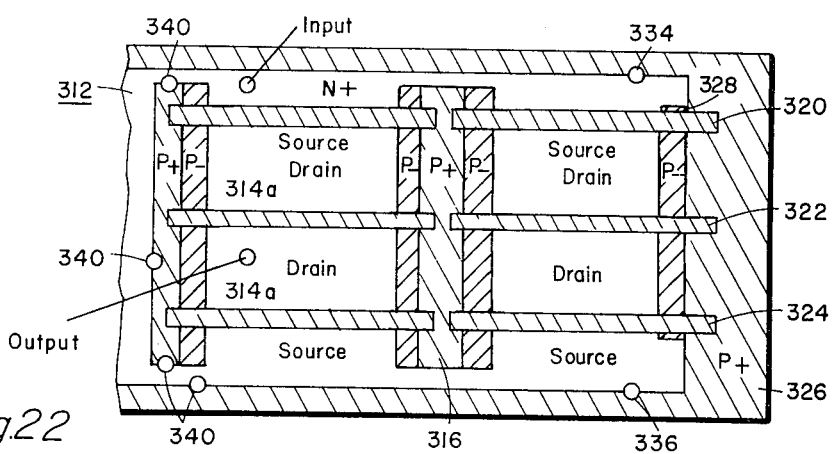
FIG. 22 is a plan view showing the formation of selected P+N+ junctions at locations having no potential difference existing between the regions.

Referring to FIG. 22, there is shown a further improvement of the structure shown in FIG. 21, the region 328 is made smaller and the P— region 314b is removed and the region 310 is electrically connected to the source region 312 by a plurality of metal plates, certain of which are shown at 340.

Figure 23:
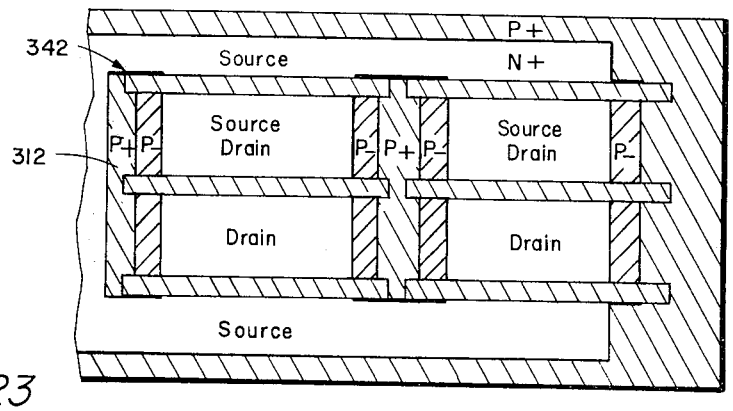
FIG. 23 is a plan view showing the combination of an area isolating diffusion with the formation of P+N+ junctions in locations having no potential difference existing between the P+ and N+ regions.

Referring to FIG. 23, there is shown a further improvement where the diffusion guard area 312 is substantially coextensive with the gates it is guarding so as not to extend transverse, to the direction of the gate, into the source area as is shown for example in FIG. 10. This gives a very compact layout for example in the area 342.

One modification of the present invention is of the type illustrated but altering the structure shown in FIG. 10, by the method of guarding gate electrodes as illustrated in FIGS. 22 and 23. In this manner, the area 15 need not surround the guard area 16 but rather is placed intermediate said consolidated areas 114 and 116 and said drain area 118 and the guard area 16.

While the invention has been particularly shown and described with reference to preferred embodiments thereof, it will be understood by those skilled in the art that the foregoing and other changes in form and details may be made therein without departing from the spirit and scope of the invention.

I claim:

1. A method for fabricating a field effect transistor having at least one guard region in a semiconductor substrate of one conductivity type, which comprises:
   forming spaced apart source and drain regions of opposite conductivity type to said substrate in said substrate,
   forming an insulating layer over the space between said source and drain regions,
   forming a conductive gate electrode having two ends over said insulating layer, and
   subsequently forming said at least one guard region so that the ends of said gate electrode are in registration with a corresponding portion of said at least one guard region.

2. The method of claim 1 in which said insulating layer is silicon dioxide and said gate electrode is silicon.

3. The method of claim 2 in which said source region extends around said drain region and a separate guard region is diffused at each end of said gate electrode.

4. The method of claim 1 in which said source region extends around said drain region and a separate guard region is diffused at each end of said gate electrode.

* * * * *